US 8,581,552 B2

(12) United States Patent
Bucur et al.

(10) Patent No.: US 8,581,552 B2
(45) Date of Patent: Nov. 12, 2013

(54) BATTERY STATE MONITORING CIRCUITRY WITH LOW POWER CONSUMPTION DURING A STAND-BY-STATE OF A BATTERY PACK

(75) Inventors: Constantin Bucur, Santa Clara, CA (US); Marian Niculae, San Jose, CA (US)

(73) Assignee: O2Micro International Limited, Grand Cayman (KY)

( * ) Notice: Subject to any disclaimer, the term of this patent is extended or adjusted under 35 U.S.C. 154(b) by 66 days.

(21) Appl. No.: 12/729,492

(22) Filed: Mar. 23, 2010

(65) Prior Publication Data

US 2010/0171502 A1 Jul. 8, 2010

Related U.S. Application Data

(62) Division of application No. 11/234,908, filed on Sep. 26, 2005, now Pat. No. 7,683,577.

(60) Provisional application No. 60/659,330, filed on Mar. 7, 2005.

(51) Int. Cl.
*H02J 7/00* (2006.01)

(52) U.S. Cl.
USPC ........................................... 320/132

(58) Field of Classification Search
USPC ............. 320/114, 132; 324/439; 429/90
See application file for complete search history.

(56) References Cited

U.S. PATENT DOCUMENTS

| | | | |
|---|---|---|---|
| 4,521,741 A | 6/1985 | Ruberl | |
| 4,636,705 A | 1/1987 | Bowman | |
| 5,089,821 A * | 2/1992 | Mori | 341/155 |
| 5,650,753 A | 7/1997 | Ling | |
| 5,712,568 A | 1/1998 | Flohr et al. | |
| 5,914,606 A | 6/1999 | Becker-Irvin | |
| 5,990,659 A * | 11/1999 | Frannhagen | 320/106 |
| 6,084,478 A | 7/2000 | Mayampurath | |
| 6,140,820 A | 10/2000 | James | |
| 6,407,579 B1 | 6/2002 | Goswick | |
| 6,411,097 B1 | 6/2002 | Ashtiani et al. | |
| 6,417,646 B1 | 7/2002 | Huykman et al. | |

(Continued)

FOREIGN PATENT DOCUMENTS

| | | |
|---|---|---|
| TW | 472451 B | 1/2002 |
| TW | 506191 B | 10/2002 |

OTHER PUBLICATIONS

Office Action from related U.S. Appl. No. 12/729,475 mailed Jun. 11, 2010.

(Continued)

*Primary Examiner* — Jue Zhang

(74) *Attorney, Agent, or Firm* — Pillsbury Winthrop Shaw Pittman LLP

(57) ABSTRACT

A battery pack including at least one battery cell, a switch, and battery state monitoring circuitry. The battery state monitoring circuitry may be configured to control an ON resistance of the switch to a first ON resistance when the switch is ON and the battery pack is in a stand-by-state and to control the ON resistance to a second ON resistance when the switch is ON and said battery pack is not in said stand-by-state, the first ON resistance greater than the second ON resistance. A cordless electrical device and method consistent with embodiments are also provided.

5 Claims, 4 Drawing Sheets

(56) References Cited

U.S. PATENT DOCUMENTS

| | | |
|---|---|---|
| 6,577,883 B1 | 6/2003 | Ueda |
| 7,495,657 B2 | 2/2009 | Cheng |
| 2003/0096158 A1 | 5/2003 | Takano et al. |
| 2003/0107347 A1 | 6/2003 | Yoshizawa et al. |
| 2004/0124879 A1 | 7/2004 | Narwal |
| 2005/0024337 A1* | 2/2005 | Cheng .......................... 345/168 |
| 2005/0134232 A1 | 6/2005 | Yamamoto |
| 2005/0280393 A1 | 12/2005 | Feldmann |
| 2006/0006840 A1 | 1/2006 | Furukawa |
| 2006/0186857 A1 | 8/2006 | Matty et al. |

OTHER PUBLICATIONS

Notice of Allowance from related U.S. Appl. No. 12/729,475 mailed Oct. 18, 2010.
Office Action from related U.S. Appl. No. 11/235,583 mailed Jun. 1, 2010.
Office Action from related U.S. Appl. No. 11/264,768 mailed Oct. 13, 2010.
Notice of Allowance dated Dec. 22, 2010 issued in related U.S. Appl. No. 12/729,475.
Chinese Office Action dated Jan. 4, 2008 issued in Chinese Patent Application No. 2006100568369, 1 page.
Chinese Office Action dated Feb. 1, 2008 issued in Chinese Patent Application No. 2006100568388, 9 pages.
U.S. Office Action dated Jan. 5, 2009 issued in U.S. Appl. No. 11234,908, 12 pages.
U.S. Office Action dated Jan. 7, 2009 issued in U.S. Appl. No. 11/264,768, 12 pages.
U.S. Office Action dated May 19, 2009 issued in U.S. Appl. No. 11/235,583, 10 pages.
U.S. Office Action dated Jun. 6, 2008 issued in U.S. Appl. No. 11/235,583, 10 pages.
U.S. Office Action dated Jun. 12, 2008 issued in U.S. Appl. No. 11/234,908, 9 pages.
U.S. Notice of Allowance dated Jul. 17, 2009 issued in U.S. Appl. No. 11/234,908, 8 pages.
U.S. Office Action dated Jul. 20, 2009 issued in U.S. Appl. No. 11/264,768, 18 pages.
U.S. Office Action dated Aug. 5, 2008 issued in U.S. Appl. No. 11/264,768, 14 pages.
U.S. Office Action dated Sep. 17, 2007 issued in U.S. Appl. No. 11/235,583, 8 pages.
U.S. Office Action dated Sep. 18, 2009 issued in U.S. Appl. No. 11/235,583, 8 pages.
Chinese Office Action dated Oct. 15, 2007 issued in Chinese Patent Application No. 2006100568373, 4 pages.
U.S. Office Action dated Nov. 6, 2008 issued in U.S. Appl. No. 11/235,583, 8 pages.
Taiwanese Office Action dated Nov. 7, 2007 issued in Taiwan patent Application No. 095104657, 8 pages.
U.S. Office Action dated Nov. 23, 2010 issued in U.S. Appl. No. 11/235,583, 10 pages.
U.S. Office Action dated Nov. 26, 2007 issued in U.S. Appl. No. 11/264,768, 11 pages.
U.S. Office Action dated Dec. 8, 2009 issued in U.S. Appl. No. 11/264,768, 18 pages.
U.S. Notice of Allowance dated Oct. 28, 2009 issued in U.S. Appl. No. 11/234,908, 12 pages.
U.S. Notice of Allowance dated Apr. 1, 2011 issued in U.S. Appl. No. 11/264,768, 9 pages.
U.S. Office Action dated Sep. 19, 2011 issued in U.S. Appl. No. 11/235,583, 10 pages.

* cited by examiner

BATTERY STATE MONITORING CIRCUITRY WITH LOW POWER CONSUMPTION DURING A STAND-BY-STATE OF A BATTERY PACK

CROSS REFERENCE TO RELATED APPLICATIONS

This is a Divisional Application of U.S. application Ser. No. 11/234,908 filed Sep. 26, 2005, now U.S. Pat. No. 7,683,577, which claims the benefit of the filing date of U.S. Provisional Application Ser. No. 60/659,330, filed Mar. 7, 2005, the teachings of which are incorporated herein by reference.

FIELD

The present disclosure relates to a battery pack for cordless electrical devices, and more particularly to a battery state monitoring circuitry to monitor conditions of the battery pack.

BACKGROUND

Various cordless electrical devices may be powered by a battery pack. Examples of such cordless electrical devices include, but are not limited to, laptop computers, cell phones, personal digital assistants, and power tools such as a drill. The battery pack may include a plurality of battery cells and power switches to allow the battery cells to either supply current (discharge operation mode) or to be charged (charge operation mode). The battery pack may also include battery monitoring circuitry powered by the battery cells to perform of number of tasks to maintain a safe and desired use of the battery cells. A large variety of such battery state monitoring circuitries have been developed to accommodate differing power management topologies.

During different times, the battery pack may be in a stand-by-state. During the stand-by-state, the battery cells neither supply a current to the load nor are connected to a charging power source. During this stand-by-state, the battery monitoring circuitry may also be in a low power state. To sense an end to the stand-by-state, conventional monitoring circuitries utilize internal components in conjunction with a sense resistor in series with the battery cells. These components may include a differential sense amplifier amplifying the voltage drop across the current sense resistor, a voltage translator that receives an output of the differential sense amplifier, and a comparator that receives an output of the voltage translator and compares that with a threshold level in order to determine the end of the stand-by-state.

In this conventional approach, and in many other similar approaches, the corresponding components of the battery state monitoring circuitry (e.g., the sense amplifier, voltage translator, and comparator as well as associated biasing and reference circuitry) consume excessive power in the stand-by-state that adversely impacts battery pack performance. For example, when the stand-by-state extends over a long period of time such as hundreds of hours, the power consumption of the battery state monitoring circuitry itself may cause a significant battery discharge. In addition, in this conventional approach the ON resistance of the discharge power switch of the battery pack remains fully ON having the same ON resistance whether the battery pack is in the stand-by-state or not.

Accordingly, there is a need for battery monitoring circuitry with relatively low power consumption during the stand-by-state of the battery pack.

BRIEF SUMMARY OF THE INVENTION

According to one aspect of the invention, there is provided a battery pack. The battery pack may include at least one battery cell, a switch, and battery state monitoring circuitry. The battery state monitoring circuitry may be configured to control an ON resistance of the switch to a first ON resistance when the switch is ON and the battery pack is in a stand-by-state and to control the ON resistance to a second ON resistance when the switch is ON and the battery pack is not in the stand-by-state, where the first ON resistance is greater than the second ON resistance.

According to another aspect of the invention, there is provided a cordless electrical device. The cordless electrical device may include a load, and a battery pack to provide power to the load. The battery pack may include at least one battery cell, a switch, and battery state monitoring circuitry. The battery state monitoring circuitry may be configured to control an ON resistance of the switch to a first ON resistance when the switch is ON and the battery pack is in a stand-by-state and to control the ON resistance to a second ON resistance when the switch is ON and the battery pack is not in the stand-by-state, where the first ON resistance is greater than the second ON resistance.

According to yet another aspect of the invention there is provided a method. The method may include driving an ON resistance of a switch of a battery pack to a first ON resistance when the switch is ON and the battery pack is in a stand-by-state, and driving the ON resistance of the switch to a second ON resistance when the switch is ON and the battery pack is not in the stand-by-state, the first ON resistance greater than the second ON resistance.

According to yet another aspect of the invention there is provided another battery pack. The battery pack may include at least one battery cell, a switch, and battery state monitoring circuitry. The battery state monitoring circuitry may be configured to monitor a supply voltage provided from the at least one battery cell to a load and may be configured to detect an end of a stand-by-state of the battery pack in response to detection of a transition of the monitored supply voltage.

BRIEF DESCRIPTION OF THE DRAWINGS

Features and advantages of embodiments of the claimed subject matter will become apparent as the following Detailed Description proceeds, and upon reference to the Drawings, where like numerals depict like parts, and in which:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
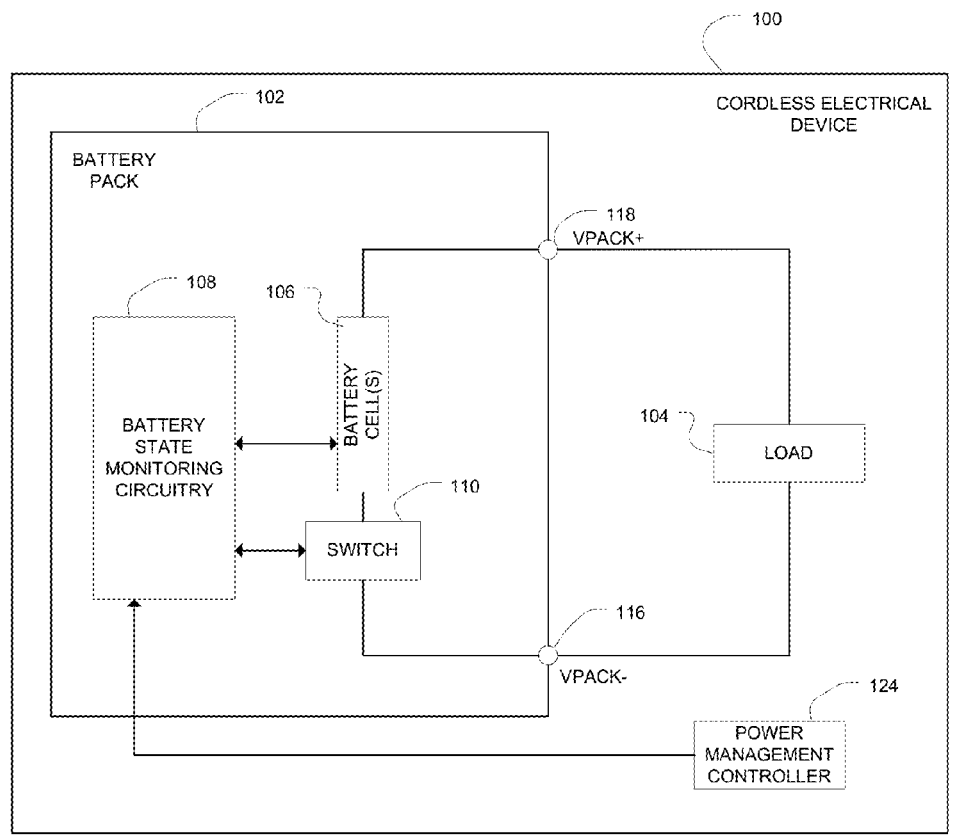
FIG. 1 is a diagram of a cordless electrical device having a battery pack with battery state monitoring circuitry.

FIG. 1 illustrates a cordless electrical device 100 having a battery pack 102 that may provide power to the load 104 during a battery supply mode. The load 104 may represent the entire load of the device 100 that may be coupled to the VPACK+ terminal 118 and the VPACK− terminal 116 of the battery pack 102. The cordless electrical device 100 may include, but not be limited to, a laptop computer, a cell phone, a personal digital assistant, and a power tool such as a drill, a circular saw, a sander, etc. In one embodiment, the load 104 may be the power tool itself when the cordless electrical device is a power tool. In addition to providing power to the load 104 in the battery supply mode, the battery pack 102 may also be recharged by a DC power source (not illustrated) such as an ACDC adapter which may also simultaneously provide power to the load 104. In other instances, the battery pack 102 may be readily removed from the cordless electrical device 100 and coupled to an external battery charger for charging purposes.

The battery pack 102 may include one or more battery cells 106, a switch 110 in series with the cells 106 such as a discharge switch or a charge switch, and battery state monitoring circuitry 108 consistent with an embodiment herein. As used in any embodiment herein, "circuitry" may comprise, for example, singly or in any combination, hardwired circuitry, programmable circuitry, state machine circuitry, and/or firmware that stores instructions executed by programmable circuitry. The battery cells 106 may be any variety of battery chemistries such as lithium ion cells. The switch 110 may be a discharge switch that closes to provide a discharge path from the battery cells 106 to the load 104 or a charge switch that closes to provide a charge path from a charging source to the battery cells 106. The switch 110 may be a transistor such as a field effect transistor (FET).

In general, the battery state monitoring circuitry 108 may sense the voltage of each one of the battery cells 106 and the charging/discharging current from and to the battery cells 106. The battery state monitoring circuitry 108 may also convert and send data regarding such measurements to the power management controller 124 of the associated cordless electrical device 100. The battery state monitoring circuitry 108 may also receive and execute instructions from the power management controller 124. The battery state monitoring circuitry 108 may also drive the switch 110 and other switches (not illustrated) of the battery pack 102 as instructed by the power management controller 124. When appropriate, the battery state monitoring circuitry 108 may also override instructions from the power management controller 124 and provide default states for the switches of the battery pack 102 when the power management controller 124 fails to send any control signals.

The battery pack 102 may be in a "stand-by-state" at certain times. As used herein, "stand-by-state" means the battery pack may not be providing a discharge current to the load 104 nor may the battery pack 102 be receiving a charging current from a charging source. In such a stand-by-state, the current flow either from (discharge) or to (charge) the battery cells 106 may be negligible. In such a stand-by-state, the battery state monitoring circuitry 108 may enter a sleep mode in order to conserve power draw from the battery cells 106 and may not provide any signals to the power management controller 124.

However, the battery state monitoring circuitry 108 may be configured to detect an end to the stand-by-state and resume its normal operations. An end to the stand-by-state may occur when discharge current flows to serve the load 104 coupled to the battery pack 102 or when a charge current flows from a charger to the cells 106. This current flow that signals an end to the stand-by-state may be referred to herein as a wake-up current to trigger a "wake-up" of the battery state monitoring circuitry 108.

To sense this wake-up current, the battery state monitoring circuitry 108 may control the ON resistance of the switch 110 which may act as a variable resistor. When in the stand-by-state, the battery state monitoring circuitry 108 may drive the ON resistance of the switch 110 to a first ON resistance. When the switch 110 is ON and not in the stand-by-state, the battery state monitoring circuitry 108 may drive the ON resistance of the switch to a second ON resistance, where the first ON resistance is greater than the second ON resistance. In one instance, the first ON resistance may be greater than about 1 ohm and the second ON resistance may be less than about 3 milliohms. The ratio of the second ON resistance to the first ON resistance may be 1:100 or more. As such, when the wake-up current begins to flow through the switch 110, the increased ON resistance of the switch 110 may result in a voltage drop that can be detected by the battery state monitoring circuitry 108. If the voltage drop across the switch is greater than or equal to a threshold level, the battery state monitoring circuitry 108 may detect an end of the state-by-state. The battery state monitoring circuitry 108 may then decrease the ON resistance of the switch to the second ON resistance and resume its normal operations until the next stand-by-state.

Figure 2:
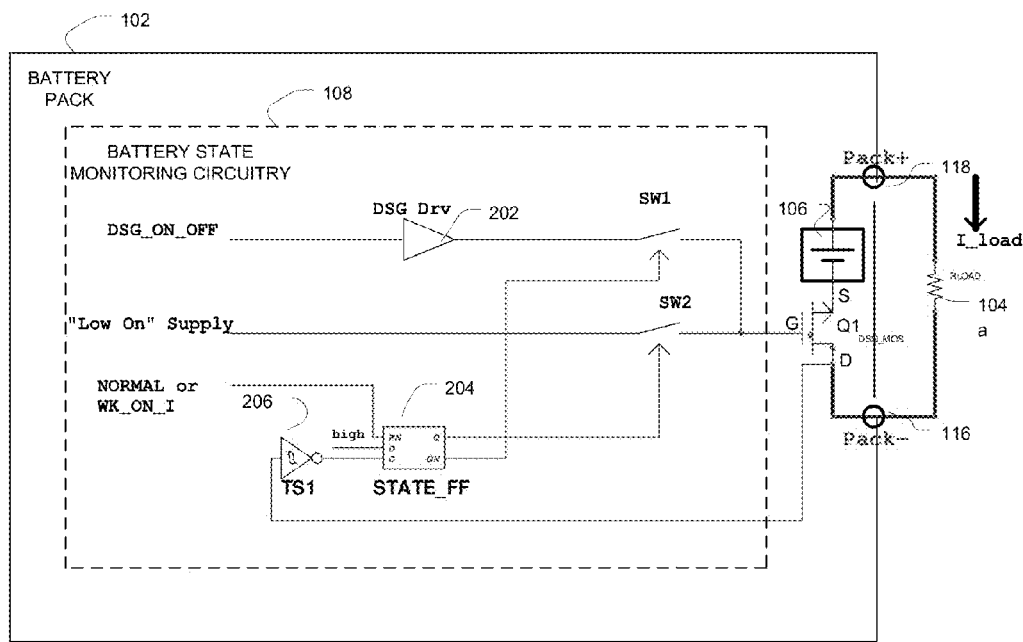
FIG. 2 is a diagram of the battery pack and battery state monitoring circuitry of FIG. 1 in more detail.

FIG. 2 illustrates the battery state monitoring circuitry 108 of the battery pack 102 of FIG. 1 in more detail. The battery state monitoring circuit 108 may include a discharge driver 202, a first switch SW1, a second switch SW2, a flip flop 204, and a trigger Schmitt circuit 206. The switch 110 of FIG. 1 may be a discharge switch that closes to provide a discharge current to the load 104a, and the discharge switch may be implemented as a transistor such as a metal oxide semiconductor field effect transistor (MOSFET) Q1. The control or gate terminal of the MOSFET Q1 may receive a control signal from the battery state monitoring circuitry 108 to control a conduction state thereof. The source terminal of the MOSFET Q1 may be coupled to the battery cells 106 while the drain terminal may be coupled to the VPACK− terminal 116 of the battery pack 102.

The trigger Schmitt circuit 206 may have an input coupled to a drain of the MOSFET Q1 and the flip flop 204 may have an input coupled to an output of the trigger Schmitt circuit 206. The first switch SW1 may be controlled by the "QN" output of the flip flop 204, while the second switch SW2 may be controlled by the "Q" output of the flip flop so that the first and second switches SW1 and SW2 are alternately ON and OFF. The "NORMAL or "WK_ON_I" signal may be provided by the power management controller 124 to the flip flop 204 before entering the stand-by-state.

In general, the MOSFET Q1 may act as a variable resistor as controlled by the battery state monitoring circuit 108. When in the stand-by-state, the battery state monitoring circuitry 108 may operate the MOSFET Q1 in a linear mode and increase the ON resistance of the MOSFET Q1 compared to its ON resistance when fully ON in a switch mode state. As such, when the wake-up current (e.g., discharge current in this instance) begins to flow through the MOSFET Q, the increased ON resistance of the MOSFET Q1 in the stand-by-state may result in a voltage drop that can be detected by the battery state monitoring circuitry 108. The battery state monitoring circuitry 108 may then decrease the ON resistance of the MOSFET Q1 at the end of the stand-by state by turning the MOSFET Q1 fully ON and resume its normal operations until the next stand-by-state.

In operation, the output signals provided by the flip flop 204 may control the state of the first switch SW1 and second switch SW2 via its output "QN" and "Q" terminals respectively. The trigger Schmitt circuit 206 may accept an analog signal representative of the voltage drop across the MOSFET Q1 and provide an output digital signal to an input of the flip flop 204. When the battery pack 102 is in the stand-by-state, the output signals from the flip flop 204 may drive the first switch SW1 OFF and the second switch SW2 ON. Hence, the "Low On" Supply may be provided to the gate terminal of the MOSFET Q1. The gate to source voltage provided by the "Low On" supply may be only slightly higher than the threshold level (Vt) of the MOSFET Q1 so that the MOSFET Q1 operates in the linear region and the ON resistance of the transistor Q1 is appreciable enough (e.g., in the ohm range in one embodiment) to provide a measurable voltage drop once the wake-up current flows from or to the cells 106.

The trigger Schmitt circuit 206 and the flip flop 204 may detect an end to the stand-by-state due to the source to drain voltage drop across the MOSFET Q1 as the wake-up current flows. The flip flop 204 may then provide output signals from its "QN" and "Q" outputs to drive the first switch SW1 ON and the second switch SW2 OFF. When discharging, the discharge driver 202 would then provide a voltage control signal to the gate of the MOSFET Q1 to drive the MOSFET Q1 fully ON. That is, the effective gate to source voltage (Vgs) of the MOSFET Q1 may be significantly larger than its threshold voltage or Vgs>>Vt. Consequently, the drain to source ON resistance for the MOSFET Q1 is quite small (e.g., in the milliohm range in one embodiment) when the MOSFET Q1 is fully ON.

Advantageously, the logic circuitry 204, 206 of the battery state monitoring circuitry 108 may perform at a high speed and with practically no current consumption when the battery pack 102 is in the stand-by-state. The high speed time may be quantified as the logic gate delay time plus the rise time of the driver. Since the circuitry is digital it may not add any extra current consumption to the digital circuit. The current consumption of a conventional battery state monitoring circuitry in the stand-by-state using a sense resistor with a sense amplifier, voltage translator, and comparator as well as associated biasing and reference circuitry may be about several milliamps while the current consumption of the embodiment of FIG. 2 may be only about several hundred microamperes. Accordingly, the relative power consumption of the battery state monitoring circuitry in the stand-by-state may be reduced significantly compared to the conventional battery state monitoring circuitry.

Figure 3:
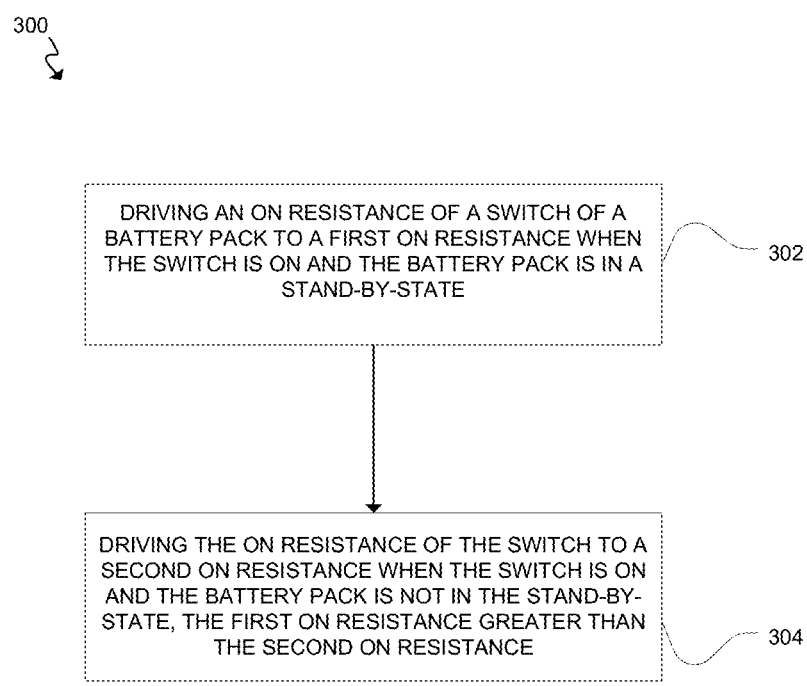
FIG. 3 is a flow chart of operations consistent with an embodiment.

FIG. 3 is a flow chart of operations 300 consistent with an embodiment. Operation 302 may include driving an ON resistance of a switch of a battery pack to a first ON resistance when the switch is ON and the battery pack is in a stand-by-state. Operation 304 may include driving the ON resistance of the switch to a second ON resistance when the switch is ON and the battery pack is not in the stand-by-state, the first ON resistance greater than the second ON resistance.

Advantageously, the battery state monitoring circuitry 108 consistent with an embodiment may perform at a high speed and with practically no current consumption when the battery pack 102 is in the stand-by-state. Therefore, a significant battery discharge may not occur even if the stand-by-state extends over long periods of time such as hundreds of hours.

Figure 4:
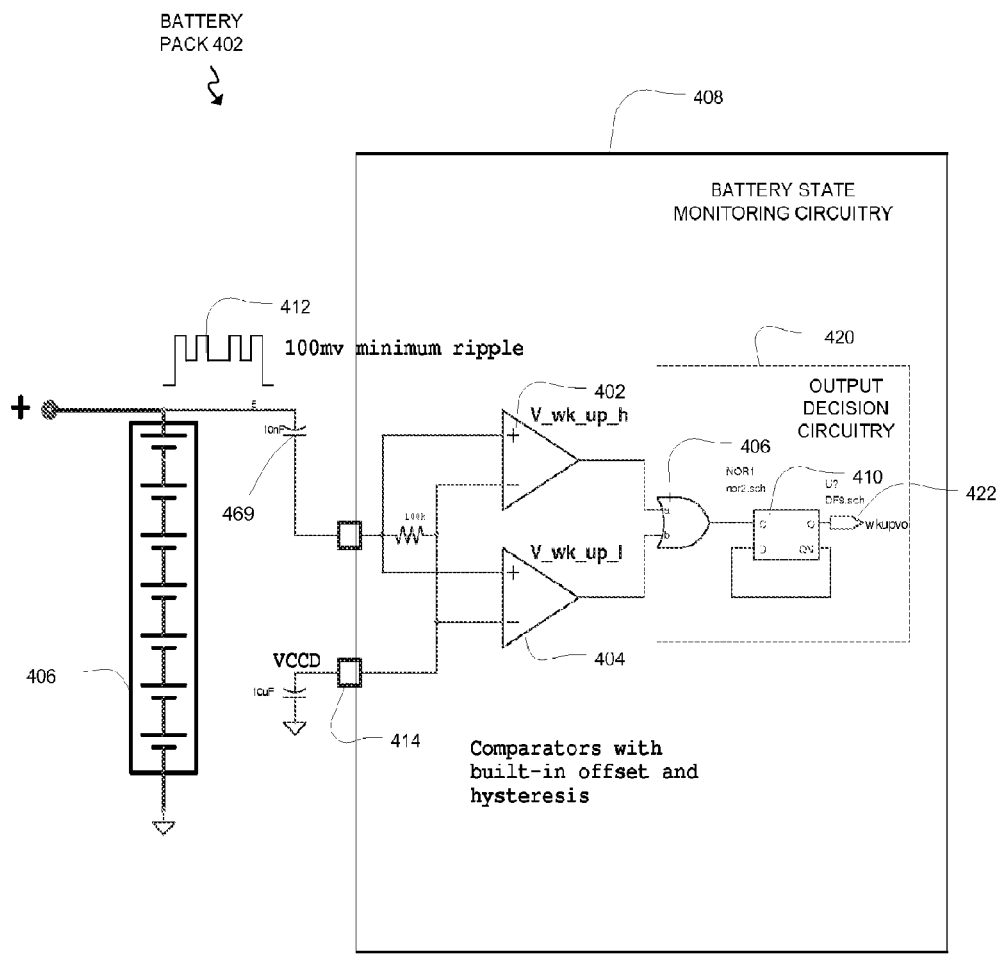
FIG. 4 is a diagram of another embodiment of the battery pack and battery state monitoring circuitry of FIG. 1.

FIG. 4 illustrates another embodiment where an end to the stand-by-state of the battery pack 402 may be detected by battery state monitoring circuitry 408 that monitors a voltage variation on the supply rail. If the battery cells 406 provide a discharge current to an inductive load, e.g., a motor of a battery powered tool, there will be a voltage variation on the supply rail and the battery state monitoring circuitry 408 may detect a transition of the monitored supply voltage 412 and hence an end to the stand-by-state of the battery pack 402. In response, the battery state monitoring circuitry 408 may wake up from a sleep mode.

The battery state monitoring circuitry 408 may include a first comparator 402, a second comparator 404, a DC blocking capacitor 469, and output decision circuitry 420. The first and second comparators 402 and 404 may be low consumption comparators with built-in offset and hysteresis. The first comparator 402 may be configured to detect a positive voltage transition of the monitored supply voltage 412 while the second comparator 404 may be configured to detect a negative voltage transition of the monitored supply voltage 412. Each comparator 402 and 404 may make comparison of the monitored supply voltage 412 to the Vccd filtered DC voltage level provided at terminal 414. The Vccd filtered DC voltage level may be provided to the inverting input terminal of the first 402 and second 404 comparators.

The first comparator 402 may be configured to detect a positive voltage transition of the supply voltage 412 and provide a first output signal. The second comparator 404 may be configured to detect a negative voltage transition of the supply voltage 412 and provide a second output signal. The output decision circuitry 420 may accept the first output signal from the first comparator 402 and the second output signal from the second comparator 404 and provide an output signal at terminal 422. The output signal provided at terminal 422 may be representative of an end of the stand-by-state of the battery pack 402 if the first output signal from the first comparator 402 is representative of a positive voltage transition or the second output signal from the second comparator 404 is representative of a negative voltage transition.

The output decision circuitry 420 may include an OR gate 406 and a flip flop 410. The OR gate may be configured to receive the first output signal from the first comparator 402 and the second output signal from the second comparator 404. The flip flop 410 may be configured to receive an output signal from the OR gate at its "C" terminal and provide the output signal at its "Q" terminal representative of the end of the stand-by-state of the battery pack if the first output signal is representative of a positive voltage transition or the second output signal is representative of a negative voltage transition.

In operation therefore, the battery state monitoring circuitry 408 may be configured to detect a positive or negative transition of the monitored supply voltage 412 when the battery cells provide a discharge current to an inductive load signaling an end to the stand-by-state of the battery pack 402. If there is no voltage transition detected by the battery state monitoring circuitry 408, this may be indicative of the battery pack in the stand-by-state and hence the battery state monitoring circuitry 408 may remain in a sleep mode.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible.

What is claimed is:

1. A battery pack comprising:
   at least one battery cell, wherein said battery cell either supplies a discharging current to a load or receives a charging current from a power source at an end of a stand-by-state of said battery pack; and
   battery state monitoring circuitry configured to detect said end of said stand-by-state of said battery pack based on a transition of a supply voltage of said at least one battery cell wherein the transition is caused by said discharging current or said charging current and said monitoring circuitry is a circuitry with low power consumption which comprises:
  a first comparator configured to detect a positive voltage transition and provide a first output signal,
  a second comparator configured to detect a negative voltage transition and provide a second output signal, wherein said first and second comparators are low consumption comparators, and
  output decision circuitry configured to accept said first output signal and said second output signal and provide an output signal, said output signal representative of said end of said stand-by-state of said battery pack if said first output signal is representative of said positive voltage transition or said second output signal is representative of said negative voltage transition.

2. The battery pack of claim 1, wherein said output decision circuitry comprises an OR gate and a flip flop, said OR gate configured to receive said first output signal and said second output signal, said flip flop configured to receive an output signal from said OR gate and to provide said output signal representative of said end of said stand-by-state of said battery pack if said first output signal is representative of said positive voltage transition or said second output signal is representative of said negative voltage transition.

3. The battery pack of claim 1, further comprising a DC blocking capacitor disposed between said at least one battery cell and said battery state monitoring circuit.

4. A battery pack comprising:
  a plurality of battery cells, wherein said battery cells either supply a discharging current to a load or receive a charging current from a power source at an end of a stand-by-state of said battery pack;
  battery state monitoring circuitry configured to detect said end of said stand-by-state of said battery pack based on a transition of a supply voltage of said plurality of battery cells, wherein the transition is caused by said discharging current or said charging current and said monitoring circuitry comprises:
    a first comparator configured to detect a positive voltage transition and provide a first output signal,
    a second comparator configured to detect a negative voltage transition and provide a second output signal, and
    output decision circuitry configured to accept said first output signal and said second output signal and provide an output signal, said output signal representative of said end of said stand-by-state of said battery pack if said first output signal is representative of said positive voltage transition or said second output signal is representative of said negative voltage transition; and
  a DC blocking capacitor disposed between said plurality of battery cells and said battery state monitoring circuitry.

5. A battery pack comprising:
at least one battery cell; and
battery state monitoring circuitry configured to detect an end of a stand-by-state of said battery pack based on a transition of a supply voltage of said at least one battery cell, wherein said monitoring circuitry comprises:
  a first comparator configured to detect a positive voltage transition and provide a first output signal,
  a second comparator configured to detect a negative voltage transition and provide a second output signal, wherein said first and second comparators are low consumption comparators with built-in offset and/or hysteresis, and
  output decision circuitry configured to accept said first output signal and said second output signal and provide an output signal, said output signal representative of said end of said stand-by-state of said battery pack if said first output signal is representative of said positive voltage transition or said second output signal is representative of said negative voltage transition.

* * * * *